(12) United States Patent
Ueda

(10) Patent No.: US 6,794,817 B2
(45) Date of Patent: Sep. 21, 2004

(54) LIGHT EMITTING DIODE LAMP AND METHOD FOR PRODUCING THE SAME

(75) Inventor: Takashi Ueda, Mie (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/277,893

(22) Filed: Oct. 23, 2002

(65) Prior Publication Data

US 2003/0076035 A1 Apr. 24, 2003

(30) Foreign Application Priority Data

Oct. 23, 2001 (JP) ......................................... 2001-325197

(51) Int. Cl.$^7$ ............................................... H05B 33/00
(52) U.S. Cl. ........................ 313/512; 313/116; 362/800
(58) Field of Search ................................ 313/512, 116, 313/500, 511; 362/800, 355, 311

(56) References Cited

U.S. PATENT DOCUMENTS 3,555,335 A * 1/1971 Johnson ....................... 313/499

FOREIGN PATENT DOCUMENTS

| JP | 5-243620 A | 9/1993 |
|----|------------|--------|
| JP | 2000-340845 A | 12/2000 |
| JP | 2001-210876 A | 8/2001 |

* cited by examiner

Primary Examiner—Joseph Williams
(74) Attorney, Agent, or Firm—Birch, Stewart, Kolasch & Birch, LLP

(57) ABSTRACT

A light emitting diode lamp has a pair of lead frames, and a light emitting element mounted on a head of one of the lead frames. A light emitting body encapsulates the heads of the lead frames and the light emitting element by molding, with the pair of lead frames having legs which stick out of a bottom surface of the light emitting body. The light emitting body is provided with protrusions at appropriate positions along the periphery of the bottom surface. The protrusions project away from the light emitting body, beyond an area in the bottom surface where the legs of the lead frames stick out. A method for producing the light emitting diode lamp is also disclosed.

12 Claims, 7 Drawing Sheets

LIGHT EMITTING DIODE LAMP AND METHOD FOR PRODUCING THE SAME

BACKGROUND OF THE INVENTION

1. Field of the Invention

The present invention relates to a light emitting diode lamp and a method for producing the same.

2. Description of the Related Art

Traditionally, many light emitting diode (hereinafter referred to as LED) lamps are manufactured by casting method which utilizes a casting mold. To form an LED lamp by casting method, the heads of lead terminals, one of which holds a light emitting element, are dipped into an epoxy resin which fills a cast. After curing of the epoxy resin, the lead terminals and their heads are encapsulated by the epoxy resin.

FIG. 9 is a side view of a conventional LED lamp, and FIG. 10 is a side view of the LED lamp of FIG. 9 as mounted on a substrate. In this case, when lead terminals 82 are dipped into an epoxy resin, surface tension at the resin surface causes the epoxy resin to creep up the basal portions of the lead terminals 82 which stick out of the bottom surface of a light emitting body 81. Inevitably, as illustrated in FIG. 9, the finished LED lamp 8 has resin bumps 84 around the basal portions of the lead terminals 82 which stick out of the bottom surface of the light emitting body 81.

Currently, with automation of the LED mounting operation, an LED lamp is directly mounted on a substrate in many cases. When leads are clinched during the automatic mounting process, the LED lamp is pulled by a lead clinching force and pressed against the substrate. In this situation, as shown in FIG. 10, the resin bumps 84 around the basal portions of the lead terminals 82 cut into, and eventually block, the terminal holes 86 in the substrate 85. In another respect, a gas is trapped in a space between the lead terminals 82 and the terminal holes 86. Under the soldering heat, the gas expands so much as to burst out toward the solder 87 side, leaving a lot of blow holes (not shown) in the solder 87. Hence, the conventional technique severely loses reliability in mounting the LED lamp 8 on the substrate. As a further disadvantage, if blow holes are found, a worker has to mend the area manually after the soldering step. Thus, generation of blow holes costs additional labor.

A technique for solving this problem is disclosed, for example, in Japanese Patent Laid-open Publication No. H5-243620. With respect to an LED lamp 9 illustrated in FIG. 11, a light emitting body 91 has a notch 93 which is formed along a part of the bottom periphery. The notch 93 serves to vent a gas trapped in a space between the surface of a substrate 95 and the light emitting body 91, thereby preventing generation of blow holes in soldering areas 97.

Nevertheless, unlike the condition illustrated in FIG. 11, the outer diameter of lead terminals 92 including the resin bumps 94 may be out of proportion relative to the inner diameter of terminal holes 96 in the substrate 95. Namely, because the conventional LED lamp 9 has the resin bumps 94 formed around the basal portions of the lead terminals 92, the outer diameter of the lead terminals 92 may possibly become larger than the inner diameter of the terminal holes 96. Under such circumstances, when the light emitting body is pulled against the substrate by a lead clinching force, the resin bumps block the terminal holes. After all, this technique may fail to vent a gas which is trapped in the space between the lead terminals and the terminal holes, thus leaving the possibility that blow holes may generate in soldering areas.

SUMMARY OF THE INVENTION

In view of these problems, it is an object of the present invention to provide a more reliable LED lamp with a reduced probability of occurrence of defective LED lamps, by surely preventing generation of blow holes in soldering areas of the LED lamp, and also to provide a method for producing such an LED lamp.

In order to achieve this object, the light emitting diode lamp of the present invention comprises a pair of lead frames, a light emitting element mounted on a head of one of the lead frames, and a light emitting body which encapsulates heads of the lead frames and the light emitting element by resin molding, with the pair of lead frames having legs which stick out of a bottom surface of the light emitting body, wherein the light emitting body is provided with a protrusion at an appropriate position along the periphery of the bottom surface, the protrusion projecting away from the light emitting body, beyond an area in the bottom surface where the legs of the lead frames stick out.

FIG. 6(*a*) is a bottom view of an LED lamp whose lead frames are positioned at the center, and FIG. 6(*b*) is a bottom view of an LED lamp whose lead frames are offset from the center.

With respect to the LED lamp 30 shown in FIG. 6(*a*), the distances from the lead frames 16 to any two points on the circumference of the LED lamp 30 are equal (A=B in the illustration). In this situation, due to surface tension, a resin which creeps up the lead frames 16 develops proportionate bumps (A=B in the illustration).

In contrast, with respect to the LED lamp 40 shown in FIG. 6(*b*), the distances from the lead frames 16 to two points on the circumference of the LED lamp 40 are different (A>B in the illustration). In this situation, due to surface tension, a resin which creeps up the lead frames 16 develops disproportionate bumps (A<B in the illustration).

According to the above LED lamp of the present invention, even in the case where the light emitting body which has bumps of molding resin around the legs of the lead frames is directly mounted on a substrate, it is possible to secure a clearance between the bottom surface of the light emitting body and the substrate. Besides, when the light emitting diode lamp is pulled toward the substrate by a lead clinching force, the resin bumps around the legs of the lead frames do not block holes formed in the substrate for the lead frames.

Regarding this LED lamp, the protrusion may be provided at a farthest position from the lead frames.

In this case, when the resin is influenced by surface tension, most of the resin creeps up the protrusion provided at a farthest position from the lead frames. Hence, the resin is efficiently deterred from creeping up in the B direction of FIG. 6(*b*). Consequently, in the case where the light emitting body is directly mounted on the substrate, it is possible to mount the light emitting body on the substrate surface in a more stable manner.

Further regarding the LED lamp, the light emitting body may be provided with two such protrusions at two positions along the periphery.

With this arrangement, the light emitting body can be stably mounted on the substrate. Besides, formation of the protrusions can be rationalized.

A method of the present invention for producing a light emitting diode lamp comprises forming a light emitting body by casting method, with the use of a mold which has a protrusion forming part at an appropriate position along a top periphery of the mold.

This method enables easy production of the light emitting diode lamp which has the above-mentioned protrusion.

Thus, the above method can omit a laborious blow hole treatment which is conventionally performed after the LED lamp is mounted on the substrate. As a result, this method can reduce the production time and improve production efficiency. Further, this method can decrease the probability of occurrence of defective LED lamps, so that LED lamps can be produced with higher reliability.

Notably, the production of the above LED lamps does not require any new equipment. Since the LED lamp production can be embodied simply with the use of a mold having a protrusion forming part concerning the present invention, it is possible to manufacture LED lamps without a significant economic burden.

BRIEF DESCRIPTION OF THE DRAWINGS

FIG. 7($b$) is a bottom view of an LED lamp with an outer diameter of 5$\phi$ (5 mm). FIG. 7($c$) is a bottom view of an LED lamp with an outer diameter of 10$\phi$ (10 mm).

DESCRIPTION OF THE PREFERRED EMBODIMENTS

Figure 1:
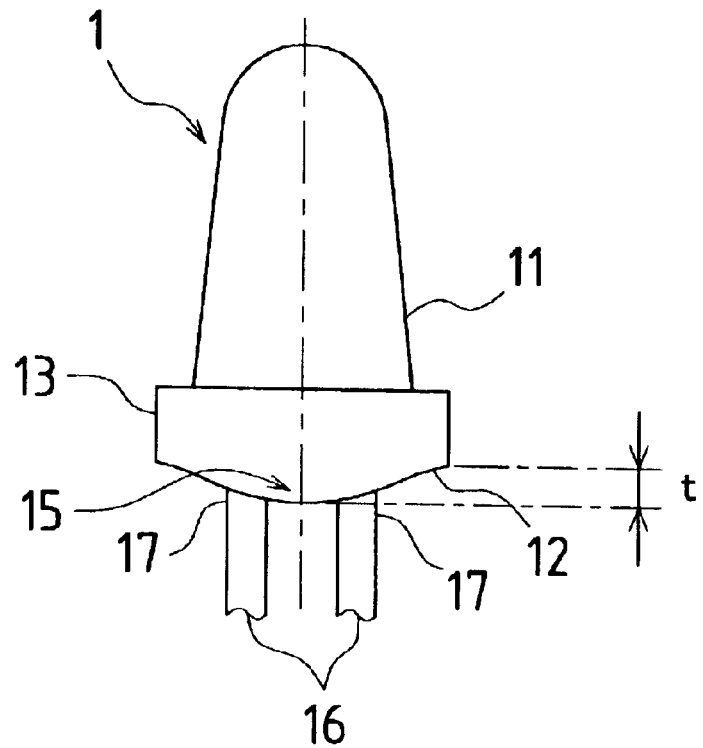
FIG. 1 is a front view of an embodiment of the LED lamp concerning the present invention.

Referring to the drawings, embodiments of the light emitting diode lamp and its production method concerning the present invention are hereinafter described in detail.

Figure 2:
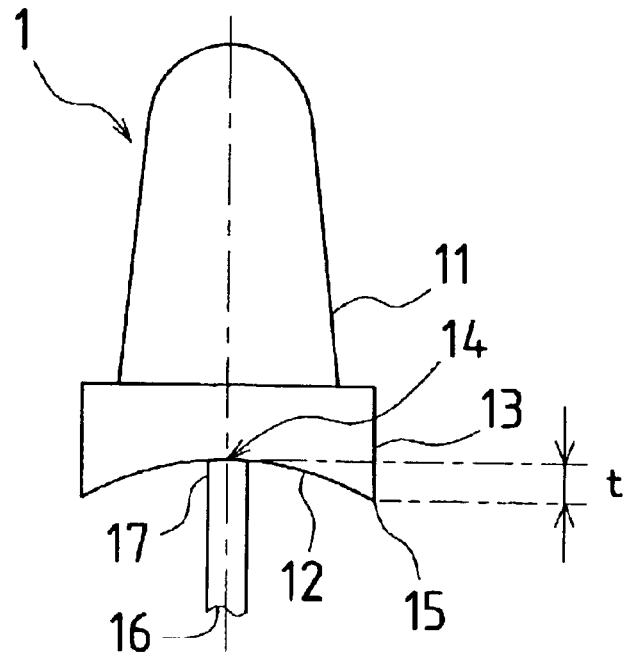
FIG. 2 is a side view of an embodiment of the LED lamp illustrated in FIG. 1.
Figure 3:
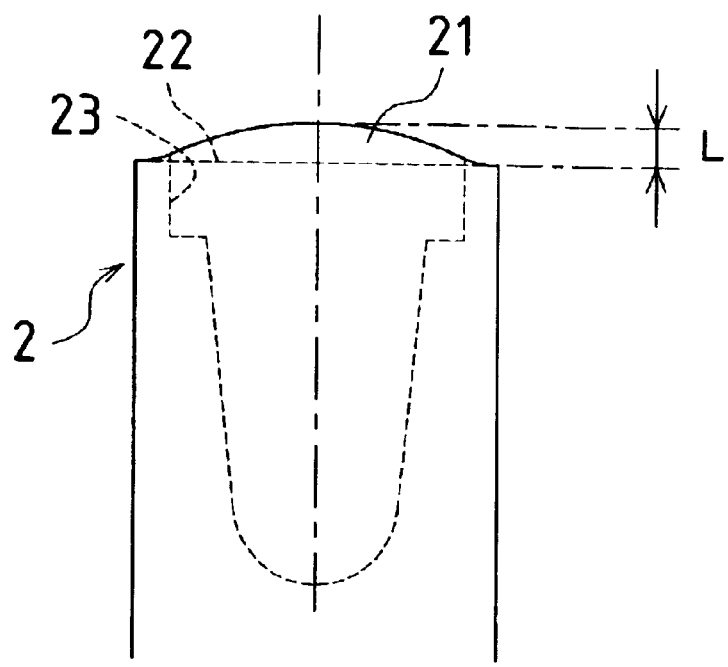
FIG. 3 is a front view showing a mold case to be used in an embodiment of the LED lamp production method concerning the present invention.
Figure 4:
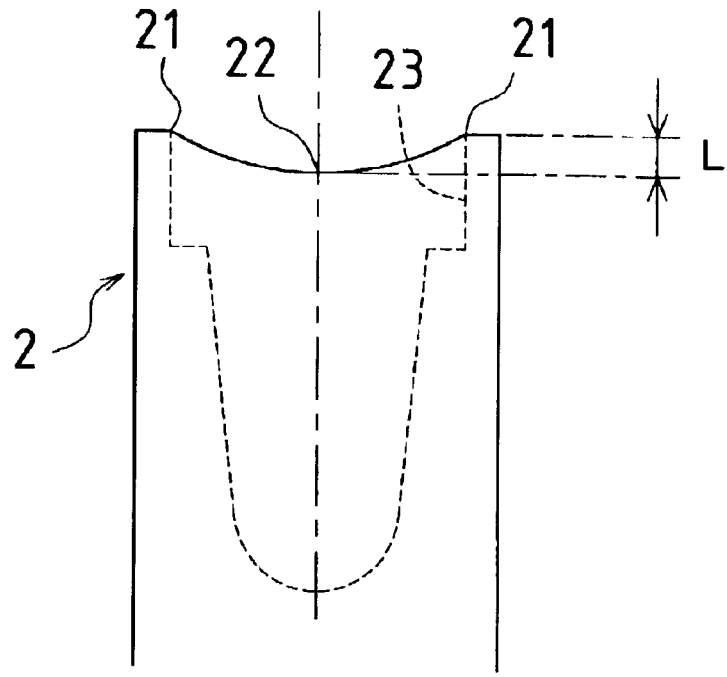
FIG. 4 is a side view of the mold case of FIG. 3.

FIG. 1 to FIG. 4 concern an embodiment of the present invention. FIG. 1 is a front view of an LED lamp; FIG. 2 is a side view of the LED lamp of FIG. 1; FIG. 3 is a front view of a mold case to be used in a method for producing the LED lamp of FIG. 1 and FIG. 2; and FIG. 4 is a side view of the mold case of FIG. 3.

As illustrated in FIG. 1 and FIG. 2, an LED lamp 1 has a light emitting body 11 which encapsulates, by resin molding, heads of a pair of lead frames 16 and a light emitting element (not shown) mounted on the head of one of the lead frames 16. As a light-emitting part, the light emitting body 11 is made of permeable epoxy resin and has a dome-shaped top section. The pair of lead frames 16 have legs 17 which stick out of a bottom surface 12 of the light emitting body 11.

With regard to the light emitting body 11, protrusions 15 are provided at appropriate positions along the periphery 13 of the bottom surface 12, in such a manner as to project away from the light emitting body 11, beyond the area where the legs 17 of the lead frames 16 stick out. In this embodiment, two protrusions 15 are formed along the periphery 13 at two positions farthest from the lead frames 16. Referring again to FIG. 1, the pair of lead frames 16 have their heads encapsulated by resin molding. Their legs 17, which are spaced from each other in a parallel relationship, stick out from near the center of the bottom surface 12 of the light emitting body 11. Along the periphery 13 of the light emitting body 11, the protrusions 15 are formed in an opposed manner across the row of the parallel legs 17 of the lead frames 16 (see FIG. 2). Each of the protrusions 15 has an identical smooth contour which corresponds to a part of a gentle arc. Each protrusion 15 has a level difference t of 0.6 mm or greater, as measured between the area where the legs 17 of the lead frames 16 stick out (hereinafter termed "reference plane 14") and the peak of each protrusion 15. In this embodiment, the outer diameter of the LED lamp is 5$\phi$, as shown in FIG. 7($b$).

Figure 7A:
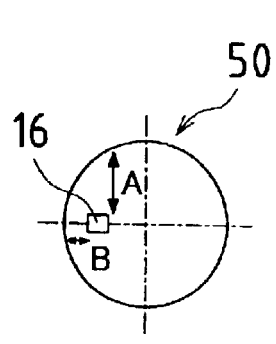
FIG. 7($a$) is a bottom view of an LED lamp with an outer diameter of 3$\phi$ (3 mm).
Figure 7B:
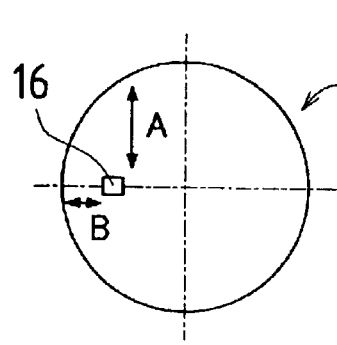
Figure 7C:
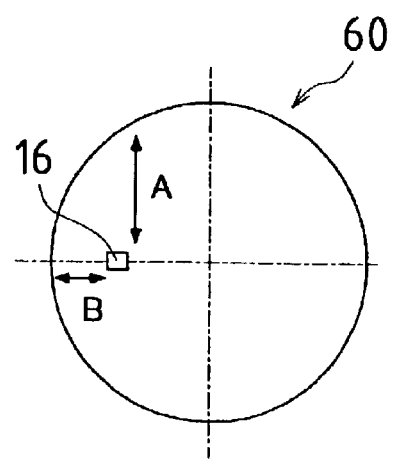

Nevertheless, the outer diameter of the LED lamp should not be limited to 5$\phi$, and may be of any suitable dimension such as 3$\phi$ or 10$\phi$ as depicted in FIG. 7($a$) or FIG. 7($c$), respectively. As for an LED lamp 50 with an outer diameter of 3$\phi$, the external contour is diminished relative to the 5$\phi$ LED lamp 1, but the lead frames 16 retain a spacing of 2.5 mm and a 0.5-mm square shape without change. Although the distance A decreases in a greater proportion than the distance B, the 3$\phi$ LED lamp 50 showed effects equivalent to those of the 5$\phi$ LED lamp 1. In the case of this 3$\phi$ LED lamp 50, the level difference t is less than 0.6 mm. If the outer diameter is reduced to less than 3$\phi$, the relationship between the distance A and the distance B (A>B) is disturbed too much to accomplish the effects of the present invention.

On the other hand, regarding an LED lamp 60 with an outer diameter of 10$\phi$, the external contour is enlarged relative to the 5$\phi$ LED lamp 1, but the lead frames 16 retain a spacing of 2.5 mm and a 0.5-mm square shape without change. Although the distance A increases in a greater proportion than the distance B, the 10$\phi$ LED lamp 60 showed effects equivalent to those of the 5$\phi$ LED lamp 1. In the case of this 10$\phi$ LED lamp 60, the level difference t is less than 0.6 mm. If the outer diameter exceeds 10$\phi$, the relationship between the distance A and the distance B is disturbed too much to accomplish the effects of the present invention.

Figure 8:
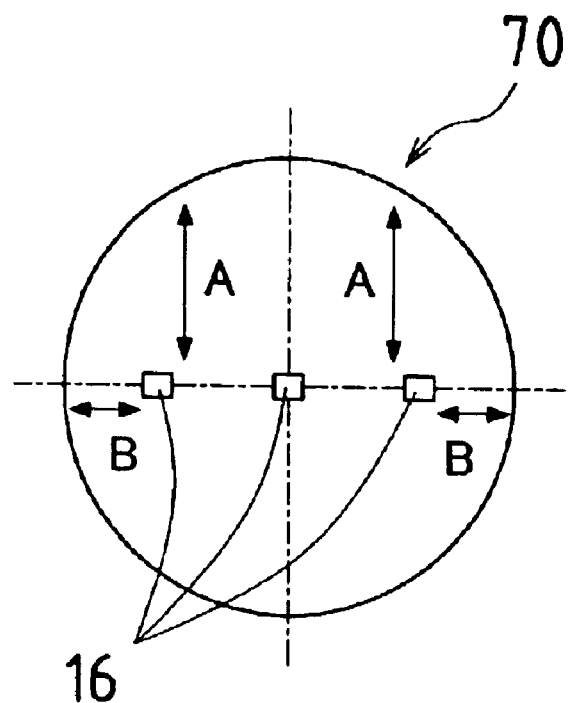
FIG. 8 is a bottom view of another embodiment of the LED lamp concerning the present invention.
Figure 9:
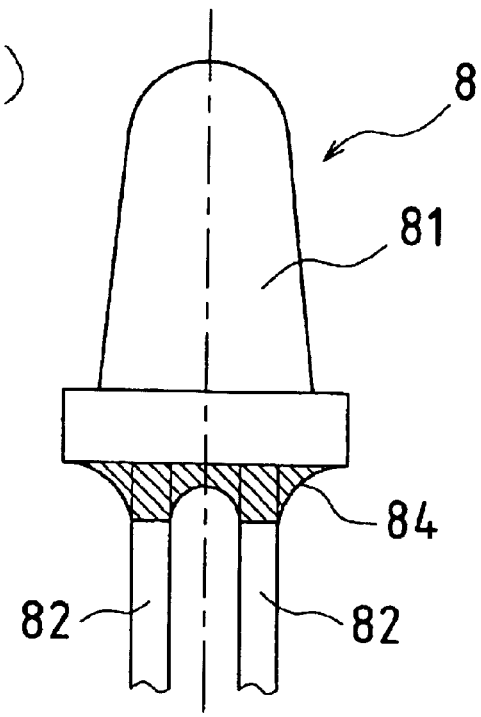
FIG. 9 is a side view showing a conventional LED lamp.
Figure 10:
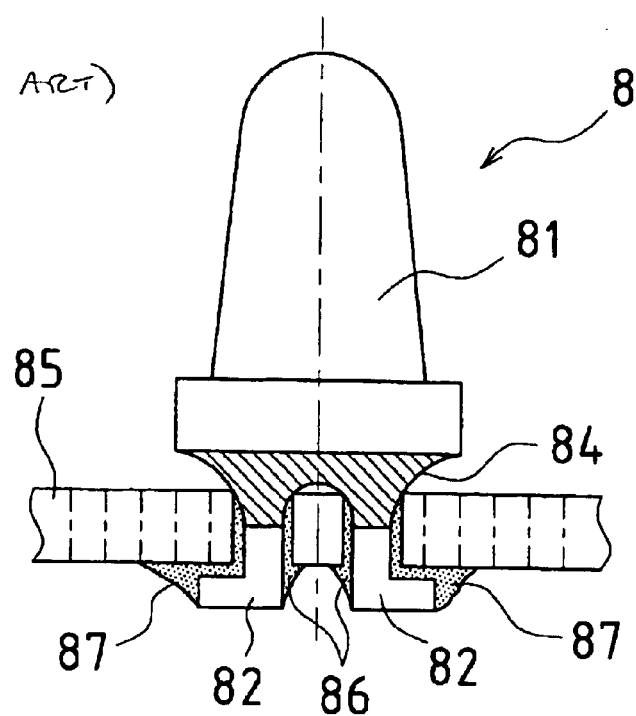
FIG. 10 is a side view showing the LED lamp of FIG. 9, as mounted on a substrate.
Figure 11:
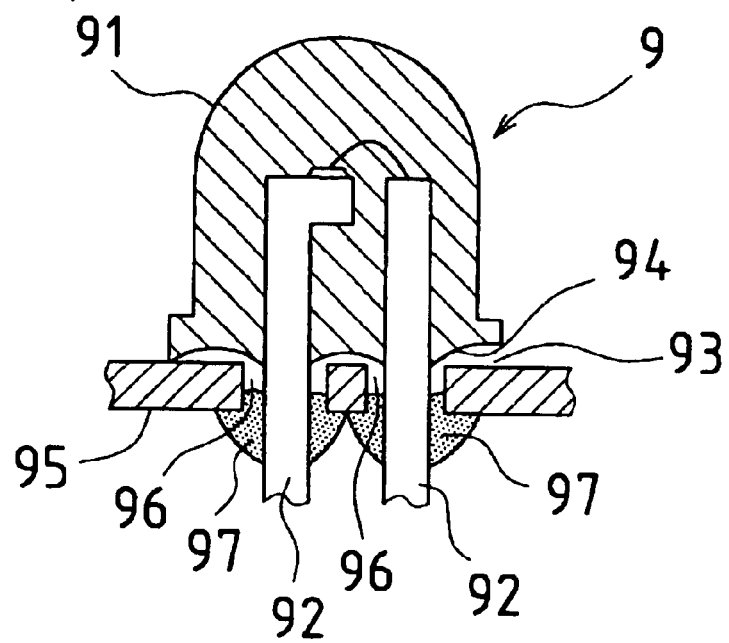
FIG. 11 is a side view showing another conventional LED lamp.

FIG. 8 is a bottom view of another embodiment of the LED lamp concerning the present invention. This embodiment is directed to a multi-lead structure having three lead frames 16. As illustrated, the present invention is also applicable to a multi-lead LED lamp having two or more lead frames, insofar as the distance A and the distance B, measured from each lead frame 16 to two points on the circumference of the LED lamp 70, maintain a similar relationship of distance as in the embodiment illustrated in FIG. 1 to FIG. 4.

The above-described LED lamp 1 is produced by a following casting method concerning the present invention.

FIG. 3 and FIG. 4 show a mold case 2 to be used as a shaping mold for the production of the LED lamp 1. The dashed lines in these illustrations delineate the internal configuration of the mold case 2.

The mold case 2 includes two protrusion forming parts 21 which are provided at two positions along its top periphery. These protrusion forming parts 21, which are opposed to each other, locate farthest from the pair of lead frames 16 to be later encased in the mold case 2. In other words, to mold the LED lamp 1, the mold case 2 receives the legs 17 of the pair of lead frames 16 which extend parallel to each other at a predetermined spacing. In this state, the protrusion forming parts 21 are to locate face to face across the row of the lead frames 16. These protrusion forming parts 21 project from the periphery of the mold case 2 in the direction away from the mold case 2. In this embodiment, they have a smooth contour which corresponds to a part of a gentle arc. The protruding length L of the protrusion forming parts 21 is 0.6 mm or greater, as measured from the peripheral line 22 of the mold case 2 to the peaks of the protrusion forming parts 21 (see FIG. 3).

Now that the manner of preparing the mold case 2 is explained, the description turns to a method for producing the LED lamp 1 with the use of the mold case 2. First of all, an epoxy resin is cast into the mold case 2 up to the peripheral line 22, in order to integrally encapsulate a pair of lead frames 16 and a light emitting element (not shown) mounted at the head of one of the lead frames 16. Once the epoxy resin is cast into the mold case 2, surface tension causes the resin to creep up internal walls 23 of the protrusion forming parts 21. Owing to this phenomenon, the liquid surface of the epoxy resin rises toward the protrusion forming parts 21 provided at the periphery, allowing formation of the protrusions 15 along the periphery of the mold case 2. In this mold case 2, the surface tension also causes the epoxy resin to creep up the legs 17 of the pair of lead frames 16, developing resin bumps around the basal ends of the legs 17. Accordingly, on the bottom surface 12 of the thus obtained light emitting body 11, there are formed the resin bumps which develop around the legs 17 of the lead frames 16 as well as the protrusions 15 which project along the periphery 13. Incidentally, the reference plane 14 is also given by the epoxy resin cast into the mold case 2. Thus, the protrusions 15 which project from the periphery 13 show a level difference of 0.6 mm or greater, as measured from the reference plane 14.

Owing to this particular level difference, the LED lamp can securely provide a clearance between the bottom surface of the light emitting body and the substrate, which makes it possible to avoid generation of blow holes at the soldering areas.

Figure 5:
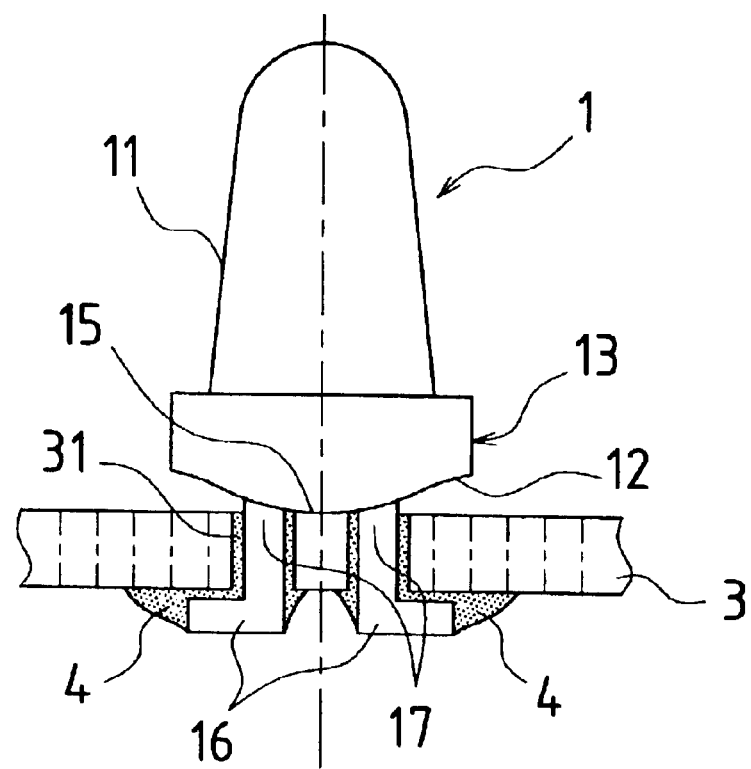
FIG. 5 is a side view showing an embodiment of the LED lamp of the present invention, as mounted on the surface of a substrate.
Figure 6A:
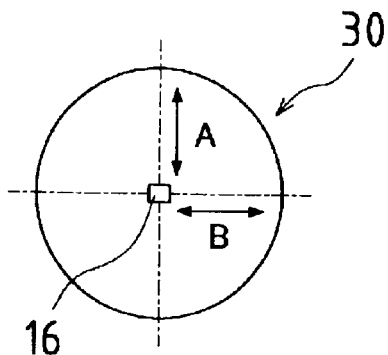
FIG. 6($a$) is a bottom view of an LED lamp whose lead frames are positioned at the center, and FIG. 6($b$) is a bottom view of an LED lamp whose lead frames are offset from the center.
Figure 6B:
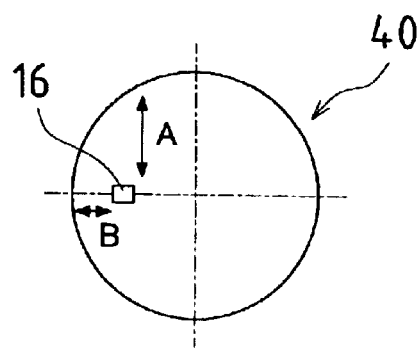

As for the mounting process, the thus produced LED lamp 1 is directly mounted on the substrate surface. FIG. 5 is a side view of the LED lamp 1 which is obtained by the above-mentioned LED lamp production method, with the LED lamp mounted on the substrate surface. A substrate 3 has a pair of holes 31 for passing the legs 17 of the lead frames 16 which stick out of the bottom surface 12 of the light emitting body 11. To mount the LED lamp 1 on the substrate 3, the legs 17 of the lead frames 16 are inserted into the holes 31 and allowed to extend beyond the back surface of the substrate 3. Next, on application of a lead clinching force, the light emitting body 11 is pulled toward the substrate 3. The lead frames 16 which stick out of the back surface of the substrate 3 are electrically connected and fixed on the back surface of the substrate 3 by solder 4.

This embodiment can certainly avoid a previous trouble concerning generation of blow holes at the soldering areas. Referring to FIG. 5 which shows the LED lamp 1 as mounted on the substrate 3, the peaks of the protrusions 15 (only one of them is seen in the illustration) of the light emitting body 11 touch the surface of the substrate 3. As mentioned earlier, the light emitting body 11 shows a level difference t between the reference plane at the bottom surface 12 and the peaks of the protrusions 15. Therefore, when the protrusions 15 touch the surface of the substrate 3, the level difference t results in creation of a clearance between the surface of the substrate 3 and the bottom surface 12 of the light emitting body 11. Also in the mounting state where the protrusions 15 touch the substrate 3, this level difference prevents the resin bumps around the legs 17 of the lead frames 16 from reaching the surface of the substrate 3. Accordingly, when the LED lamp 1 is pulled toward the substrate 3 by a lead clinching force, the resin bumps around the legs 17 of the lead frames 16 do not block the holes 31. Consequently, a gas trapped in a space between the lead frames 16 and the holes 31 can easily escape through a clearance created between the surface of the substrate 3 and the bottom surface 12 of the light emitting body 11. At the same time, it is possible to avoid generation of blow holes at soldering areas.

In the above LED lamp, each of the protrusions 15 has a smooth external contour which corresponds to a part of a gentle arc. This contour effectively prevents the molding resin from developing burrs. Moreover, because the protrusions 15 locate along the periphery 13 at two positions farthest from the lead frames 16, the LED lamp can be mounted on the surface of the substrate 3 in a more rational and stable manner.

Further regarding the contour of the protrusions 15, the above embodiments adopt an external contour which corresponds to a part of a gentle arc, as a non-limitative example. Alternatively, the present invention may employ protrusions of other shapes (e.g. those with rectangular ends) to achieve the same effects. Furthermore, as for the number of protrusions 15, the above embodiments utilize two protrusions which are provided along the periphery. In addition, it is also possible to realize the present invention by forming three or more protrusions, for example, along the periphery.

The present invention may be embodied in other specific forms without departing from the spirit or essential characteristics thereof. The above embodiments are therefore to be considered in all respects as illustrative and not restrictive, the scope of the invention being indicated by the appended claims rather than by the foregoing description. All changes which come within the meaning and range of equivalency of the claims are therefore intended to be embraced therein.

This application is based on Patent Application No. 2001-325197 filed in Japan, the contents of which are incorporated hereinto by reference. Likewise, the entire contents of the reference cited herein are incorporated hereinto by reference.

What is claimed is:

1. A light emitting diode lamp comprising a pair of lead frames, a light emitting element mounted on a head of one of the lead frames, and a molded light emitting body which encapsulates heads of the lead frames and the light emitting element, with the pair of lead frames having legs which stick out of a bottom surface of the light emitting body which bottom surface comprises a freely exposed surface during the molding of the light emitting body, wherein the light emitting body is provided with a protrusion at an appropriate position along the periphery of the bottom surface, the protrusion projecting away from the light emitting body, beyond an area on the bottom surface where the legs of the lead frames stick out.

2. The light emitting diode lamp according to claim 1, wherein the protrusion is provided at a farthest position from the lead frames.

3. The light emitting diode lamp according to claim 1 or 2, wherein the light emitting body is provided with at least two said protrusions at at least two positions along the periphery.

4. A method for producing a light emitting diode lamp which comprises forming a light emitting body by casting method, with the use of a mold which has a protrusion forming part at an appropriate position along a top periphery of the mold.

5. The light emitting diode lamp of claim 3, wherein at least two protrusions are formed in opposed positions on the periphery of the bottom surface of said molded body, and each protrusion comprises a smooth contour.

6. The light emitting diode lamp of claim 1, wherein the at least one protrusion extends at least 0.6 mm beyond the bottom surface at the location where the legs of the lead frames stick out.

7. A method for producing a light emitting diode lamp comprising:
    inserting one or more lead frames and an associated light emitting element into a mold with legs of said lead frames extending from an open portion of the mold;
    providing a protrusion forming part adjacent said open portion of the mold; and
    inserting moldable material into the mold to form a light emitting body conforming to the shape of the mold and having a surface portion formed freely at the open portion of the mold with said legs extending from said surface portion;
    wherein the moldable material adheres to the protrusion forming part as a result of surface tension characteristics of the moldable material.

8. The method of claim 7, wherein the protrusion is formed at a peripheral portion of said freely formed surface.

9. A product manufactured by the process of claim 7.

10. A product manufactured by the process of claim 8.

11. A light emitting diode lamp comprising a pair of lead frames, a light emitting element mounted on a head of one of the lead frames, and a light emitting body which encapsulates heads of the lead frames and the light emitting element, with the pair of lead frames having legs which stick out of a non-planar bottom surface of the light emitting body,
    wherein the light emitting body is provided with a protrusion at an appropriate position along the periphery of the bottom surface, the protrusion projecting away from the light emitting body, beyond an area on the bottom surface where the legs of the lead frames stick out.

12. A light emitting diode lamp comprising a pair of lead frames, a light emitting element mounted on a head of one of the lead frames, and a light emitting body which encapsulates heads of the lead frames and the light emitting element, with the pair of lead frames having legs which stick out of a bottom surface of the light emitting body, a portion of the material forming the light emitting body extending along the legs away from said bottom surface,
    wherein the light emitting body is provided with a protrusion at an appropriate position along the periphery of the bottom surface, the protrusion projecting away from the light emitting body, beyond an area on the bottom surface where the legs of the lead frames stick out.

* * * * *